United States Patent [19]
Ogihara et al.

[11] Patent Number: 5,530,268
[45] Date of Patent: Jun. 25, 1996

[54] LIGHT-EMITTING DIODE ARRAY WITH ANTI-REFLECTION COATING PROVIDING REDUCED INTERNAL REFLECTION

[75] Inventors: Mitsuhiko Ogihara; Yukio Nakamura; Takatoku Shimizu; Masumi Taninaka, all of Tokyo, Japan

[73] Assignee: Oki Electric Industry Co., Ltd., Tokyo, Japan

[21] Appl. No.: 326,499

[22] Filed: Oct. 20, 1994

[30]     Foreign Application Priority Data

Oct. 20, 1993 [JP] Japan .................................. 5-262803

[51] Int. Cl.⁶ .................................................. H01L 33/00
[52] U.S. Cl. .............................. 257/88; 257/91; 257/98; 257/644; 257/650
[58] Field of Search .................... 257/98, 88, 89, 257/90, 94, 650, 644, 641, 91, 93, 99

[56]     References Cited

U.S. PATENT DOCUMENTS 5,077,587 12/1991 Albergo et al. ................. 257/98 X

FOREIGN PATENT DOCUMENTS

| 0197719 | 10/1986 | European Pat. Off. ................. 257/98 |
| 53-12288 | 2/1978 | Japan ........................................ 257/98 |
| 1047082 | 2/1989 | Japan ........................................ 257/98 |
| 1-150559A | 6/1989 | Japan . |

*Primary Examiner*—William Mintel
*Attorney, Agent, or Firm*—Spencer & Frank

[57]     ABSTRACT

An LED array is fabricated by forming an insulating film on a semiconductor substrate of a first conductive type, forming a plurality of windows in the insulating film, and diffusing an impurity of a second conductive type through these windows to create a plurality of diffusion regions. In addition, an anti-reflection coating consisting of one or more transparent dielectric thin films is formed on the diffusion regions where they are exposed in the windows. The thickness of the anti-reflection coating, or of its constituent thin films, is optimized for maximum transmission of light.

10 Claims, 4 Drawing Sheets

PRIOR ART

LIGHT-EMITTING DIODE ARRAY WITH ANTI-REFLECTION COATING PROVIDING REDUCED INTERNAL REFLECTION

BACKGROUND OF THE INVENTION

This invention relates to a light-emitting diode array structured so as to enhance output efficiency by reducing internal reflection, and to a method of fabricating such an array.

Light-emitting diode arrays (hereinafter referred to as LED arrays) are employed in, for example, electrophotographic printers and copiers, where they create images by illuminating a photosensitive drum. A conventional LED array is formed on an n-type semiconductor substrate by the following steps. First, one surface of the substrate is coated with an insulating layer. Next, the insulating layer is etched, using a patterned etch mask, to create a plurality of windows below which the substrate is exposed. A p-type impurity is diffused through the windows into the substrate, forming a p-type diffusion region below each window. Finally, electrodes are formed on both surfaces of the substrate.

When current is supplied through the electrodes, light is emitted near the pn junctions between the p-type diffusion regions and n-type substrate. Much of the emitted light exits through the windows and can be used for image formation or other purposes. However, part of the light is lost due to internal reflection at the interface between the p-type diffusion region and air, which occurs because of the great disparity between their refractive indexes, e.g., 3.5 for the p-type diffusion region versus unity for air.

This problem came to the inventors' attention when they measured the emission profile of a single LED in an LED array. FIG. 6 shows the results. A plan view of the LED can be seen at the top of FIG. 6, illustrating the insulating film 12 and one window 14, below which is a p-type diffusion region 16. The p-type diffusion region actually extends out to the dotted line in FIG. 6, so it includes a side area 20 disposed below the insulating film 12. An electrode 22 makes contact with part of the p-type diffusion region 16. Current was fed through this electrode, and the intensity of emitted light was measured along line D—D.

The graph at the bottom of FIG. 6 shows the general form of the intensity profiles obtained in this way. Intensity is shown on the vertical axis and position on the horizontal axis, matching position on the above-mentioned line D—D. Even though light emitted from the side areas 20 of the LED had to travel through the insulating film 12, a greater intensity was measured over these side areas 20 than over the window 14. If the maximum intensity over the side areas is 100%, the intensity over the window 14 was about 20% less.

This result could be explained if the insulating film 12 were acting as an anti-reflection coating. Other possible explanations involve the depth of the pn junction, which is greater under the window 14 than in the side areas 20. In any case, it would clearly be advantageous to obtain a 100% intensity profile across the entire surface of the LED, and this can be done by reducing internal reflection in the window 14.

SUMMARY OF THE INVENTION

It is accordingly an object of the present invention to reduce internal reflection in an LED array.

The invented LED array is fabricated by forming an insulating film on a semiconductor substrate of a first conductive type, forming a plurality of windows in the insulating film, and diffusing an impurity of a second conductive type through these windows into the semiconductor substrate to create a plurality of diffusion regions below the windows. In addition, an anti-reflection coating is formed on the diffusion regions where they are exposed in the windows. The anti-reflection coating may comprise two thin films with different refractive indexes, the lower film also being used to protect the semiconductor substrate surface during the impurity diffusion step. In this case the thickness of one of the two thin films is preferably optimized with respect to the thickness of the other thin film, so as to maximize the transmission of light.

DETAILED DESCRIPTION OF THE INVENTION

Figure 1:
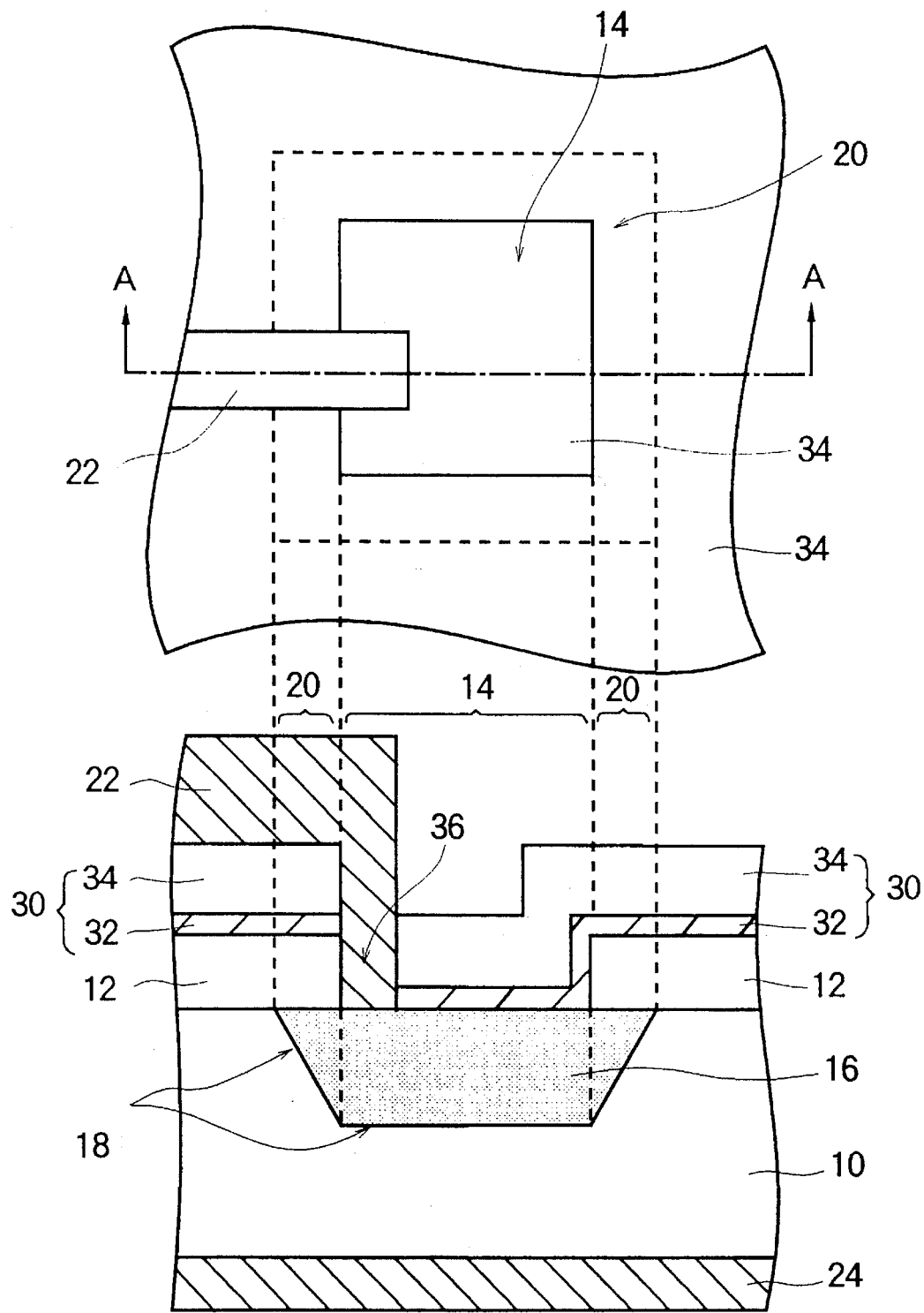
FIG. 1 shows top and sectional views of one LED in a novel LED array.

A novel LED array and fabrication method thereof will be described with reference to FIGS. 1 to 5. These drawings will show only one LED in the array, but it will be clear that the novel features can be extended to the entire array. The drawings illustrate the sizes, shapes, and positional relationships of the constituent elements schematically; they are intended to provide an understanding of the invention, but should not be interpreted as restricting the scope of the invention as defined in the appended claims. Elements corresponding to elements in FIG. 6 have the same reference numerals.

The invented array comprises a plurality of LEDs of, for example, the type shown in FIG. 1. The LEDs may be disposed in a linear array or any other type of array; the invention is applicable to any arrangement of LEDs.

The LEDs are formed in an n-type semiconductor substrate 10 having a gallium arsenide phosphide (GaAsP) epitaxial layer doped with an n-type impurity such as tellurium (Te). The upper surface of the wafer 10 is coated with an insulating film 12 comprising, for example, aluminum oxide ($Al_2O_3$) or silicon nitride (SiN). A multilayer insulating film 12 comprising both of these materials is also possible. So as not to impede the passage of light, the insulating film 12 should not be too thick; a thickness of about two hundred to two hundred fifty nanometers (200 to 250 nm) is preferable.

For each LED in the array, a window 14 is opened in the insulating film 12, and a p-type impurity such as zinc (Zn) is diffused through the window 14 to form a p-type diffusion region 16. The diffusion process proceeds laterally as well as downward in the substrate 10, so the p-type diffusion region 16 extends underneath the sides of the insulating film 12 surrounding the window 14. A pn junction 18 is formed at the interface between the n-type semiconductor substrate 10 and p-type diffusion region 16. The pn junction 18 consists of a substantially flat part under the window 14 and a sloping part in the side areas 20 under the insulating film 12.

An upper electrode 22 made of a conductive material such as aluminum extends down through the window 14 and makes ohmic contact with part of the upper surface of the p-type diffusion region 16. Each LED has its own upper electrode 22. A lower electrode 24 is formed on the entire lower surface of the substrate 10, serving all LEDs in the array.

A novel feature of the invented LED array is an anti-reflection coating 30 which overlies the windows 14. In FIG. 1 the anti-reflection coating also overlies the insulating film 12. The anti-reflection coating 30 is a transparent dielectric film that is structured so as to reduce internal reflection and increase the transmittance of light from the p-type diffusion regions 16 below the windows 14 into the air above the windows 14. Typically, the anti-reflection coating 30 comprises one or more thin films having refractive indexes intermediate between the refractive index of the p-type diffusion region 16 and the refractive index of air. The anti-reflection coating 30 in FIG. 1 is a bi-layer coating comprising a first thin film of phospho-silicate glass (PSG) 32 and a second thin film of aluminum oxide ($Al_2O_3$) 34. A contact hole 36 is opened through these first and second thin films 32 and 34 to provide the ohmic contact with the upper electrode 22.

Next the operation of the novel LED array will be described.

When a forward voltage is applied between the upper electrode 22 and lower electrode 24, light is emitted in all directions by the well-known mechanism of electron-hole recombination near the pn junction 18. In traveling out through the window 14, light is partially reflected at the interfaces between the p-type diffusion region 16 and first thin film 32, between the first and second thin films 32 and 34, and between the second thin film 34 and the air above, but the total light loss due to these reflections is less than the loss that would occur if the surface of the p-type diffusion region 16 were interfaced directly to air, as in the prior art.

The optical transmittance T of the anti-reflection coating 30 is given by the following equation:

$$T=1-(r \times r^*)$$

where r is a complex number describing the reflectivity of the anti-reflection coating 30 as a whole, and $r^*$ is the complex conjugate of r. For a bi-layer anti-reflection coating 30, the reflectivity r can be calculated from the following quantities:

λ: wavelength of emitted light
n: refractive index of p-type diffusion region 16
$n_0$: refractive index of air
$n_1$: refractive index of first thin film 32
$d_1$: thickness of first thin film 32
$n_2$: refractive index of second thin film 34
$d_2$: thickness of second thin film 34
$\delta_1$: phase shift of light in transit through first thin film 32, calculated as $\delta_1=4\pi n_1 d_1/\lambda$
$\delta_2$: phase shift of light in transit through second thin film 34, calculated as $\delta_2=4\pi n_2 d_2/\lambda$
$r_1$: reflectivity at interface between p-type diffusion region 16 and first thin film 32, calculated as $r_1=(n-n_1)/(n+n_1)$
$r_2$: reflectivity at interface between first thin film 32 and second thin film 34, calculated as $r_2=(n_2-n_1)/(n_2+n_1)$
$r_3$: reflectivity at interface between second thin film 34 and air, calculated as $r_3=(n_2-n_0)/(n_2+n_0)$ With these definitions, r is equal to the following fraction:

$$\frac{r_1 + r_2\exp(-i\delta_1) + r_3\exp[-i(\delta_1 + \delta_2)] + r_1 r_2 r_3 \exp(-i\delta_2)}{1 + r_1 r_2 \exp(-i\delta_1) + r_1 r_3 \exp[-i(\delta_1 + \delta_2)] + r_2 r_3 \exp(-i\delta_2)}$$

Once the materials of the first and second thin films 32 and 34 have been selected and their refractive indexes are known, maximizing the transmittance T is a matter of selecting the thicknesses $d_1$ and $d_2$. If one of these thicknesses, such as $d_1$, is set to some convenient value, the optimum value of the other thickness, e.g. $d_2$, can be calculated from the equation above. Suppose, for example, that the following values are used:

λ=740 nm (emitted wavelength of light)
n=3.5 (refractive index of p-type diffusion region)
$n_0$=1 (refractive index of air)
$n_1$=1.4 (refractive index of PSG)
$n_2$=1.6 (refractive index of $Al_2O_3$)
$d_1$=20 nm (thickness of PSG thin film 32)

Then the value of the transmittance T is found to be maximum when the thickness $d_2$ of the $Al_2O_3$ thin film 34 is substantially 100 nm.

The above thicknesses of 20 nm and 100 nm can be taken as nominal values, but satisfactory performance is obtained even if the thicknesses deviate somewhat from these values, provided the deviation is sufficiently small in relation to the wavelength λ. With the above wavelength of 740 nm, for example, satisfactory performance is obtained if the thickness $d_1$ of the PSG film 32 is from about 10 to 20 nm and the thickness $d_2$ of the $Al_2O_3$ film 34 is from about 150 to 250 nm.

If the anti-reflection coating 30 is structured as a single layer, the above equations can still be used for optimization, by setting $n_1$ equal to $n_2$. This procedure can be used, for example, when the anti-reflection coating 30 is a single layer of $Al_2O_3$.

Next a process for fabricating the novel LED array will be described with reference to FIGS. 2 to 4.

Figure 2:
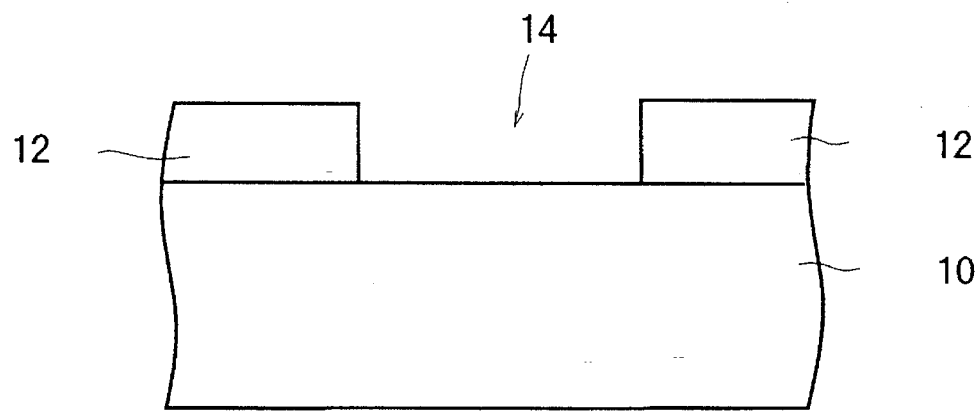
FIG. 2 shows a first step in the fabrication of the novel LED array.

Referring to FIG. 2, in the first step an n-type semiconductor substrate 10 having a GaAsP epitaxial layer is obtained, and its surface is prepared by standard treatment with organic solvents and acid. Next an $Al_2O_3$ film is deposited onto the surface of the substrate 10 to a thickness of substantially 200 nm by the sputtering method, forming the insulating film 12. Then windows 14 are created in the insulating film 12 by a standard photolithographic process.

Figure 3:
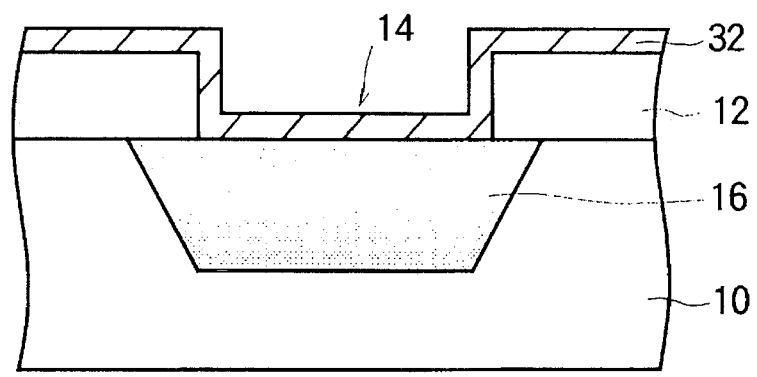
FIG. 3 shows a second step in the fabrication of the novel LED array.

Referring to FIG. 3, in the next step a PSG film 32 with a thickness $d_1$ of 20 nm is formed by chemical vapor deposition (CVD) over the insulating film 12 and windows 14, creating the first thin film of the anti-reflection coating. The PSG film 32 also functions as a protective film, preventing the escape of substrate elements (e.g. gallium, arsenic, and phosphorous) during the subsequent diffusion process.

A p-type impurity such as zinc is now diffused through the PSG thin film 32 into the substrate 10 below the windows 14, forming the p-type diffusion regions 16. The diffusion conditions (time and temperature) are controlled so as to obtain a diffusion depth of from 5 to 7 μm. Conventional diffusion conditions can be used, including a diffusion temperature of at least 750° C.

Figure 4:
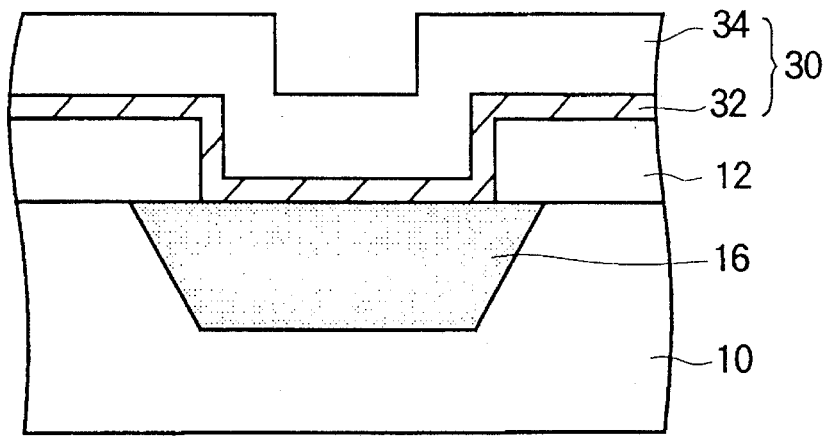
FIG. 4 shows a third step in the fabrication of the novel LED array.

Referring to FIG. 4, in the next step an $Al_2O_3$ film 34 is deposited onto the PSG film 32 by the sputtering method, forming the second thin film of the anti-reflection coating 30. The thickness $d_2$ of the $Al_2O_3$ film 34 is 100 nm.

After these steps, the anti-reflection coating 30 is patterned by photolithography to form the contact holes 36 shown in FIG. 1. The size of the contact holes 36 depends on the anticipated electrical current density, but is typically about 9×9 μm. The surface of the p-type diffusion regions 16 exposed under the contact holes 36 is treated with buffered hydrofluoric acid, then a layer of aluminum 2.5 μm thick is deposited over the entire anti-reflection coating 30 and contact holes 36, the aluminum being deposited by electron-beam evaporation. The substrate 10 should preferably be maintained at a temperature of 50° C. or less while the aluminum is being deposited. The aluminum is then patterned by photolithography to create the upper electrodes 22.

The lower electrode 24 on the underside of the substrate 10 is formed by successively depositing films of a gold-germanium-nickel alloy (AuGeNi) and of gold (Au), by electron-beam evaporation. This completes the structure shown in FIG. 1.

Figure 5:
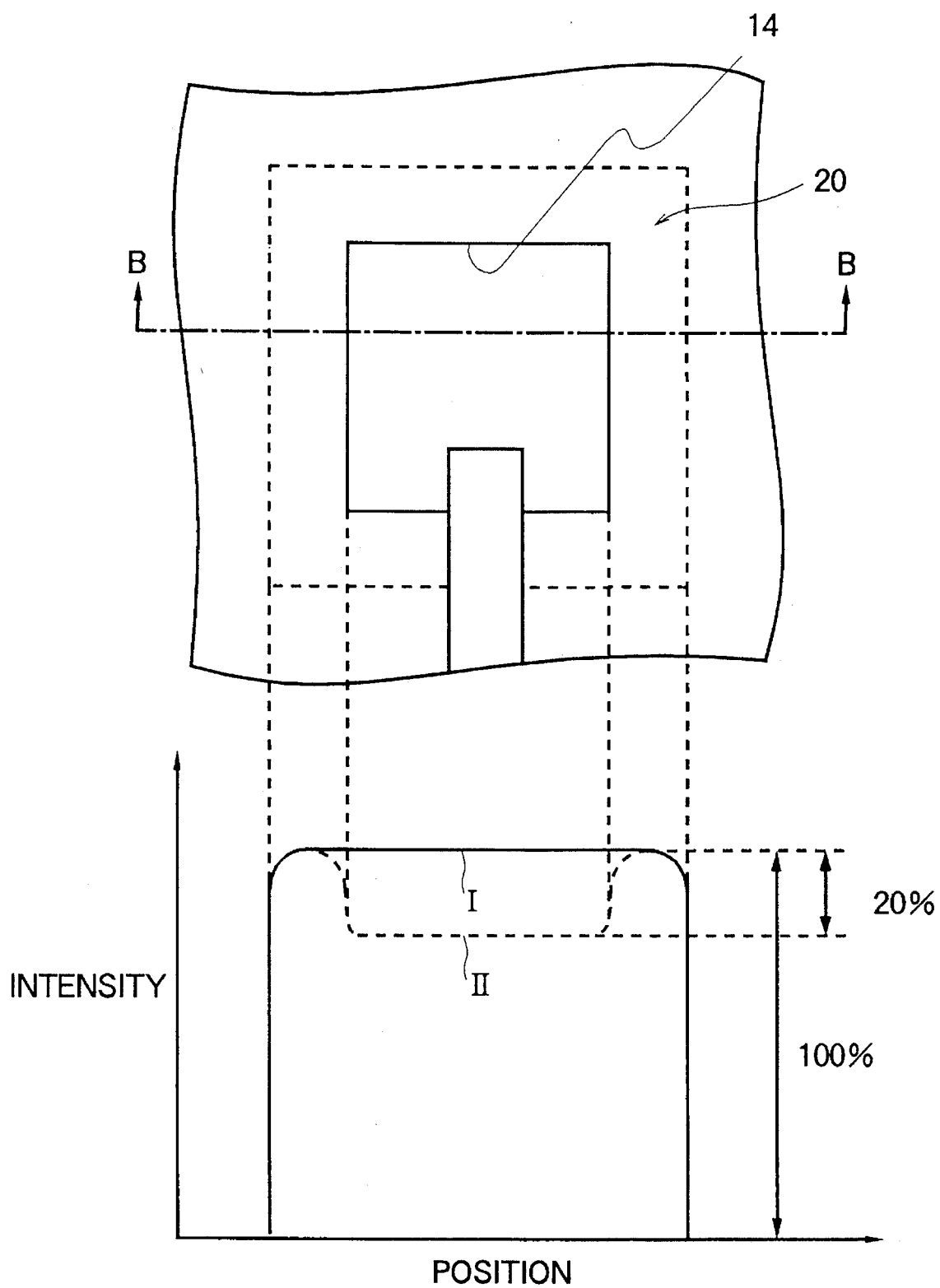
FIG. 5 compares the light intensity profile of an LED in the novel LED array with that of an LED in a conventional array.
Figure 6:
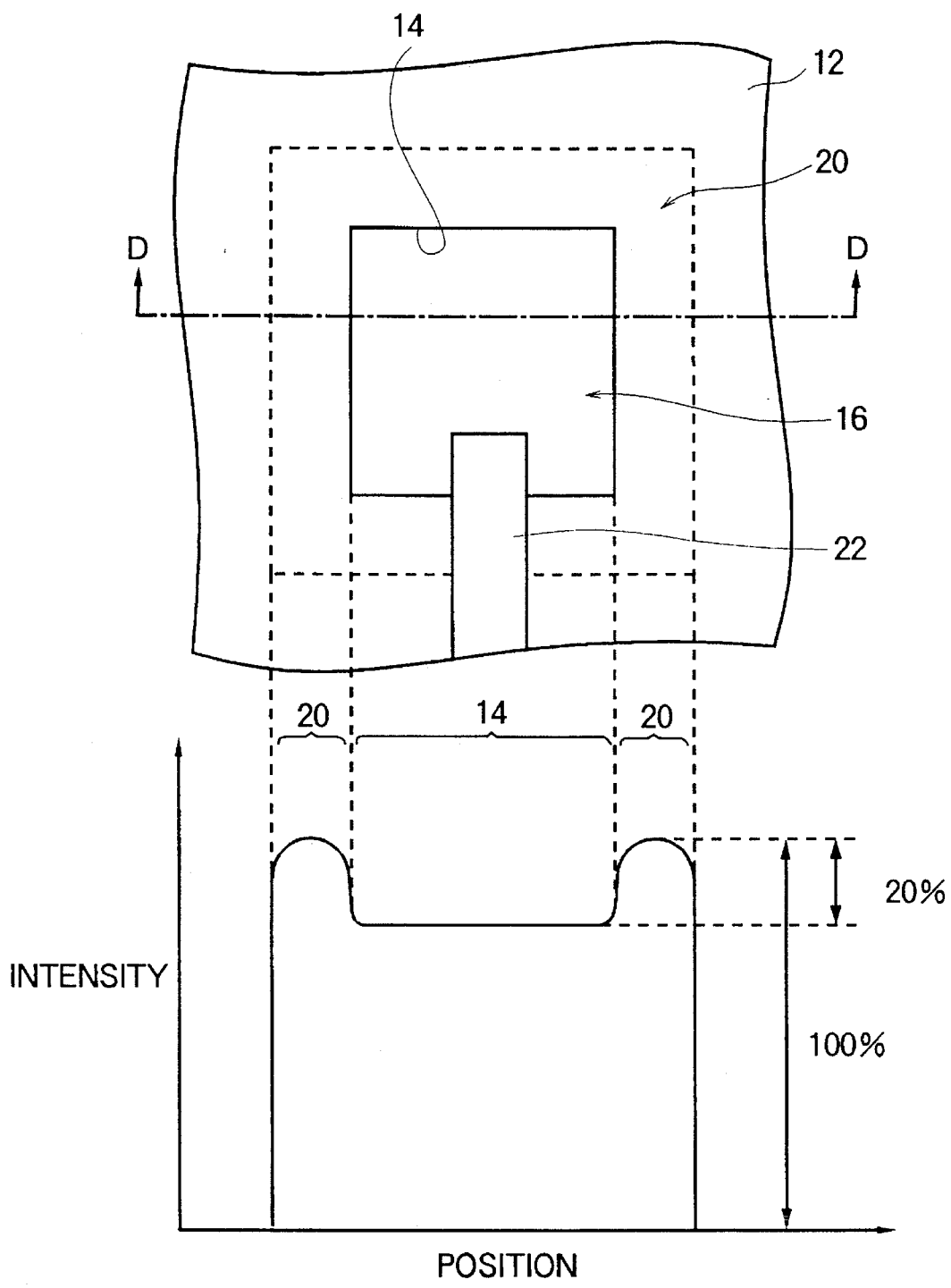
FIG. 6 shows the intensity profile of an LED in a conventional LED array.

FIG. 5 illustrates the effect of the invention by showing the same type of plan view and graph that was shown in FIG. 6 for the prior art. Position on line B—B corresponds to the horizontal axis in the graph. The intensity of emitted light is shown on the vertical axis of this graph. The solid line (I) shows the general form of intensity profiles measured for the novel LED array shown in FIG. 1. The dotted line (II) is the profile that was shown in FIG. 6 for a conventional LED array lacking the anti-reflection coating 30.

The value 100% in FIG. 5 indicates the maximum intensity of light emitted from the side area 20 for both the conventional and novel LED arrays. In the novel array, the intensity profile in the window 14 is substantially constant at this 100% value, whereas in the conventional array, the intensity dropped by about 20% inside the window 14 as mentioned before. By increasing the intensity of light emitted from the window 14 of the LED to a value substantially equal to the value in the side area 20, the invention increases the overall efficiency of the LED array, thereby decreasing the amount of electrical power needed to drive the array.

Although the anti-reflection coating 30 in FIG. 1 covered both the windows 14 and insulating film 12, in general it is not necessary for the anti-reflection coating 30 to cover the insulating film 12; it suffices to cover the parts of the surface of the p-type diffusion regions 16 exposed in the windows 14. Moreover, the invention is not restricted to the materials, dimensions, thicknesses, and processing conditions mentioned above. For example, the substrate 10 may be p-type and the diffusion regions 16 n-type, and those skilled in the art will recognize that further modifications are possible without departing from the scope claimed below.

What is claimed is:

1. An LED array, comprising:

a semiconductor substrate of a first conductive type;

an insulating film formed on one surface of said semiconductor substrate, having a plurality of windows;

a plurality of diffusion regions of a second conductive type disposed below respective windows, formed by diffusion of an impurity through said windows into said semiconductor substrate; and an anti-reflection coating covering exposed portions of said diffusion regions in said windows, consisting of at least a first thin film of phospho-silicate glass and a second thin film of aluminum oxide.

2. The array of claim 1, wherein said diffusion regions have a refractive index n, said first thin film has a first thickness $d_1$ and a first refractive index $n_1$, said second thin film has a second thickness $d_2$ and a second refractive index $n_2$, air having a refractive index $n_0$, and said first thickness $d_1$ and said second thickness $d_2$ are selected to maximize a transmittance T defined as follows:

$$T = 1 - (r \times r^*)$$

where r is a complex number, $r^*$, is the complex conjugate of r, and r is equal to:

$$\frac{r_1 + r_2\exp(-i\delta_1) + r_3\exp\{-i(\delta_1+\delta_2)\} + r_1 r_2 r_3 \exp(-i\delta_2)}{1 + r_1 r_2 \exp(-i\delta_1) + r_1 r_3 \exp\{-i(\delta_1+\delta_2)\} + r_2 r_3 \exp(-i\delta_2)}$$

$r_1$ being a reflectivity at an interface between said p-type diffusion regions and said first thin film, calculated as $r_1 = (n-n_1)/(n+n_1)$;

$r_2$ being a reflectivity at an interface between said first thin film and said second thin film, calculated as $r_2 = (n_2-n_1)/(n_2+n_1)$;

$r_3$ being a reflectivity at an interface between said second thin film and air, calculated as $r_3 = (n_2-n_1)/(n_2+n_1)$;

$\delta_1$ being a phase shift of light in transit through said first thin film, calculated as $\delta_1 = 4\pi n_1 d_1/\lambda$;

$\delta_2$ being a phase shift of light in transit through said second thin film, calculated as $\delta_2 = 4\pi n_2 d_2/\lambda$; and $\lambda$ being a wavelength of light emitted from said diffusion regions.

3. The LED array of claim 1, further comprising a plurality of electrodes disposed over said insulating film, extending to respective windows, and making electrical contact with said diffusion regions in said windows, wherein:

said anti-reflection coating has contact holes through which said electrodes make said electrical contact with said diffusion regions; and said anti-reflection coating extends between said electrodes and said insulating film.

4. The LED array of claim 1, wherein said insulating film comprises a film of $Al_2O_3$.

5. The LED array of claim 2, further comprising a plurality of electrodes disposed over said insulating film, extending to respective windows, and making electrical contact with said diffusion regions in said windows, wherein:

said anti-reflection coating has contact holes through which said electrodes make said electrical contact with said diffusion regions; and said anti-reflection coating extends between said electrodes and said insulating film.

6. The LED array of claim 2, wherein said insulating film comprises a film of $Al_2O_3$.

7. The LED array of claim 2, wherein $\lambda$ is approximately 740 nm, n is approximately 3.5, $n_0$ is 1.0, $n_1$ is approximately 1.4, $n_2$ is approximately 1.6, $d_1$ is approximately 20 nm, and $d_2$ is approximately 100 nm.

8. The LED array of claim 2, wherein $\lambda$ is approximately 740 nm, n is approximately 3.5, $n_0$ is 1.0, $n_1$ is approximately 1.4, $n_2$ is approximately 1.6, $d_1$ is in a range from 10 nm to 20 nm, and $d_2$ is in a range from 150 nm to 250 nm.

9. The LED array of claim 1, wherein said substrate comprises a GaAsP epitaxial layer, wherein said insulating film comprises a film of Al$_2$O$_3$ of approximately 200 nm thickness, wherein said first thin film of phospho-silicate glass is approximately 20 nm thick, and wherein said second thin film comprises a film of Al$_2$O$_3$ of approximately 100 nm thickness.

10. The LED array of claim 2, wherein said substrate comprises a GaAsP epitaxial layer, wherein said insulating film comprises a film of Al$_2$O$_3$ of approximately 200 nm thickness, wherein said first thin film of phospho-silicate glass is approximately 20 nm thick, and wherein said second thin film comprises a film of Al$_2$O$_3$ of approximately 100 nm thickness.

* * * * *

UNITED STATES PATENT AND TRADEMARK OFFICE
CERTIFICATE OF CORRECTION

PATENT NO. : 5,530,268
DATED : June 25, 1996
INVENTOR(S) : Mitsuhiko OGIHARA ET AL.

It is certified that error appears in the above-indentified patent and that said Letters Patent is hereby corrected as shown below:

In the Claims:

Claim 2, lines 18 and 19, delete in their entirety and replace with -- $r_3$ being a reflectivity at an interface between said second thin film and air, calculated as $r_3 = (n_2 - n_0)/(n_2 + n_0)$; --

Signed and Sealed this

Third Day of February, 1998

BRUCE LEHMAN

Attest:

Attesting Officer

Commissioner of Patents and Trademarks